(12) United States Patent
Kruip (10) Patent No.: US 7,071,694 B1
(45) Date of Patent: Jul. 4, 2006

(54) MAGNET ASSEMBLY OF AN MRI SYSTEM WITH CONCENTRIC ANNULAR FERROMAGNETIC LAMINATIONS

(75) Inventor: Marcel Jan Marie Kruip, Oxfordshire (GB)

(73) Assignee: Oxford Magnet Technology Limited, Witney (GB)

( * ) Notice: Subject to any disclaimer, the term of this patent is extended or adjusted under 35 U.S.C. 154(b) by 345 days.

(21) Appl. No.: 10/111,629

(22) PCT Filed: Oct. 12, 2000

(86) PCT No.: PCT/GB00/03908

§ 371 (c)(1),
(2), (4) Date: Nov. 9, 2002

(87) PCT Pub. No.: WO01/31359

PCT Pub. Date: May 3, 2001

(30) Foreign Application Priority Data

Oct. 29, 1999 (GB) ................... 9925513.5

(51) Int. Cl.
*G01V 3/00* (2006.01)
*H01F 7/00* (2006.01)
*H01F 1/00* (2006.01)

(52) U.S. Cl. ................ 324/323; 335/296; 335/301
(58) Field of Classification Search ........ 335/296–299, 335/216, 301, 304, 306; 324/315–322; 505/211; 29/602.1
See application file for complete search history.

(56) References Cited

U.S. PATENT DOCUMENTS

| | | | | |
|---|---|---|---|---|
| 4,783,628 A | * | 11/1988 | Huson | 324/320 |
| 4,818,966 A | | 4/1989 | Miyamoto et al. | 335/296 |
| 4,822,772 A | * | 4/1989 | Huson | 505/211 |
| 4,943,774 A | * | 7/1990 | Breneman et al. | 324/318 |
| 5,061,897 A | * | 10/1991 | Danby et al. | 324/318 |
| 5,124,651 A | * | 6/1992 | Danby et al. | 324/318 |
| 5,134,374 A | * | 7/1992 | Breneman et al. | 324/319 |
| 5,194,810 A | * | 3/1993 | Breneman et al. | 324/319 |
| 5,229,723 A | * | 7/1993 | Sakurai et al. | 324/319 |
| 5,463,364 A | | 10/1995 | Mueller | 335/299 |
| 5,555,251 A | * | 9/1996 | Kinanen | 324/319 |

(Continued)

FOREIGN PATENT DOCUMENTS

EP 0407227 1/1991

(Continued)

Primary Examiner—Diego Gutierrez
Assistant Examiner—Tiffany A. Fetzner
(74) Attorney, Agent, or Firm—Crowell & Moring LLP (57) ABSTRACT

The present invention is a saturated ferromagnetic structure for controlling the homogeneity of the primary magnet field of a magnet in a Magnetic Resonance Imaging system. The structure has a plurality of coaxial laminations disposed thereon about a central axis of the structure, such that the structure is magnetically saturated and generates a magnetic field parallel to the central axis. In use the structure functions to improve the homogeneity of the primary magnetic field. The structure further allows for a MRI system with a less confined patient space than is currently available with known MRI systems.

18 Claims, 10 Drawing Sheets

U.S. PATENT DOCUMENTS

| | | | | |
|---|---|---|---|---|
| 5,570,073 A | | 10/1996 | Mueller | 335/299 |
| 5,680,086 A | * | 10/1997 | Allis et al. | 335/296 |
| 5,825,187 A | * | 10/1998 | Ohashi et al. | 324/319 |
| 6,150,819 A | * | 11/2000 | Laskaris et al. | 324/319 |
| 6,259,252 B1 | * | 7/2001 | Laskaris et al. | 324/319 |
| 6,429,761 B1 | * | 8/2002 | Laskaris et al. | 335/299 |
| 6,694,602 B1 | * | 2/2004 | Laskaris et al. | 29/602.1 |
| 6,794,973 B1 | * | 9/2004 | Aoki et al. | 335/299 |
| 2001/0005165 A1 | * | 6/2001 | Laskaris et al. | 335/299 |
| 2002/0021129 A1 | * | 2/2002 | Laskaris et al. | 324/318 |

FOREIGN PATENT DOCUMENTS

| | | | |
|---|---|---|---|
| EP | 0645641 A1 | | 3/1995 |
| EP | 0998876 A1 | | 5/2000 |
| EP | 0999456 A2 | | 5/2000 |
| GB | 2282451 A | * | 4/1995 |
| GB | 2355800 A | * | 5/2001 |
| GB | 2400916 A | * | 10/2004 |
| WO | 94/18682 | | 8/1994 |
| WO | WO 01/31359 A1 | * | 5/2001 |

* cited by examiner

PRIOR ART

MAGNET ASSEMBLY OF AN MRI SYSTEM WITH CONCENTRIC ANNULAR FERROMAGNETIC LAMINATIONS

The present invention relates to an improved magnet. More specifically, the present invention relates to a saturated ferromagnetic structure for controlling the homogeneity of the field of a magnet. Furthermore, the present invention relates to an improved Magnetic Resonance Imaging (MRI) system, in particular having a less confined patient space.

MRI systems consist of a magnet which provides a primary magnetic field, a set of gradient coils to superimpose a linearly varying field as a function of time over the primary magnetic field, and an RF coil transmit/receive system which is used to receive the signals that are used to construct the image. A high degree of homogeneity of the primary magnetic field in the system is essential for producing good quality images. These fields can be generated by a number of devices, such as coil magnets or permanent magnets, or a combination of the two. Ferromagnetic material is known to be used, in addition to the above magnetic field generators, to increase the field strength, improve homogeneity, and to limit stray magnetic fields.

Where high magnetic fields are required with a magnetic induction of 0.5 Tesla or more, superconducting coils are used. Most superconducting MRI magnets consist of an assembly of coaxial superconducting coils. These coils are positioned in such a way that the required field strength and homogeneity is achieved. In these type of magnets the patient is positioned with the head-feet axis in line with the axis of the coils. The disadvantage of such an arrangement is that the patient has to be located inside a tube, which makes the patient feel trapped and causes him stress.

Figure 1:
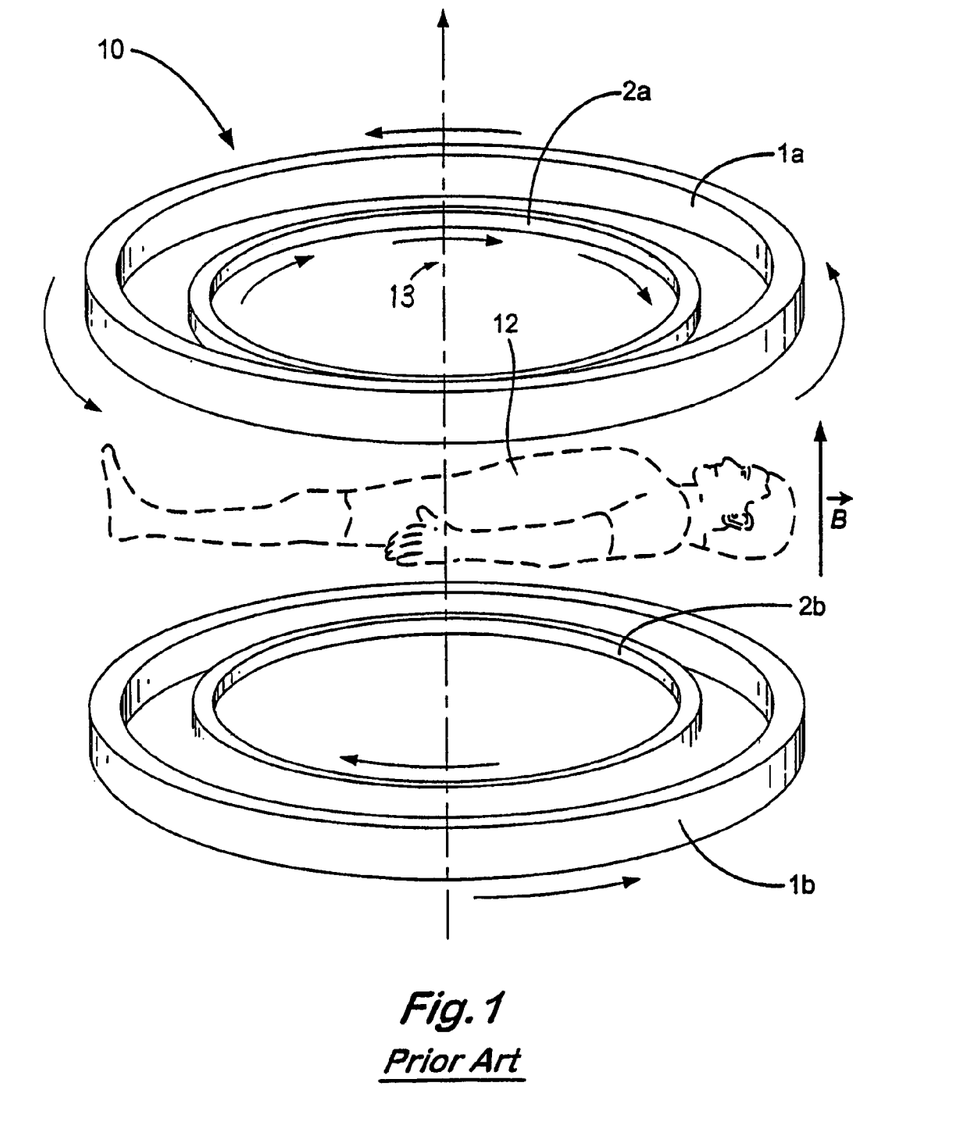

FIG. 1 is a known magnetic assembly 10 comprising an arrangement of coaxial pairs of superconducting coils 1a, 1b, 2a, 2b with currents running in the opposite sense to each other. The larger diameter coils 1a, 1b are known in the art as the drive coils and provide most of the primary magnetic field $\vec{B}$. The pairs of coils 1a, 2a and 1b, 2b are arranged in planes which are essentially parallel to each other. A patient 12 is located in the space between the coils and in a plane parallel to the coils. The primary magnetic field $\vec{B}$ is essentially parallel to the central axis 13 of the coils. The space between the pairs of coils must be sufficient to allow a patient to fit comfortably. In order to constrain the size of the overall MRI system, the diameter of the drive coils 1a, 1b is limited. The combined effect of these space restrictions is a reduction in the homogeneity of the primary magnetic field $\vec{B}$ produced by the drive coils. To counter this a second pair of coils 2a, 2b is provided inside of and coaxial to the drive coils, but with a current running through them in the opposite sense from the current running through the drive coils. Each pair of compensating coils introduces higher order contaminants which adversely effects the homogeneity of the primary magnetic field. Furthermore, the confined space in which a patient must be situated during operation of the MRI system can cause the patient stress.

It is known for MRI systems which only require low magnetic fields of less than 0.4 Tesla to adopt more open magnet structures. This has the effect of reducing the patient's feelings of confinement.

However, MRI magnet designs which aim to reduce the patient's feelings of confinement tend to restrict the freedom of position of the coils. The addition of further coils to improve homogeneity of the primary magnet field is also restricted by these limitations on space.

Theoretically, the nesting of a series of coaxial coil pairs with currents running in the opposite sense can be arranged to compensate for higher order contaminants and thus improve the homogeneity of the primary magnetic field.

EP0284439A discloses a magnetic field generating device in which a peripheral portion of each pole plate is laminated in a direction perpendicular to the sides of the pole plate, in order to effectively increase the magnetic field intensity. EP0645641A discloses an MRI magnet having pole pieces of wound soft magnetic material. This improves the magnetic field and eliminates saturation effects. EP0407227A discloses the use of a number of permanent magnets or pieces of magnetic material placed on pole pieces of an MRI magnet, for improving the homogeneity of the resultant magnetic field.

Figure 2:
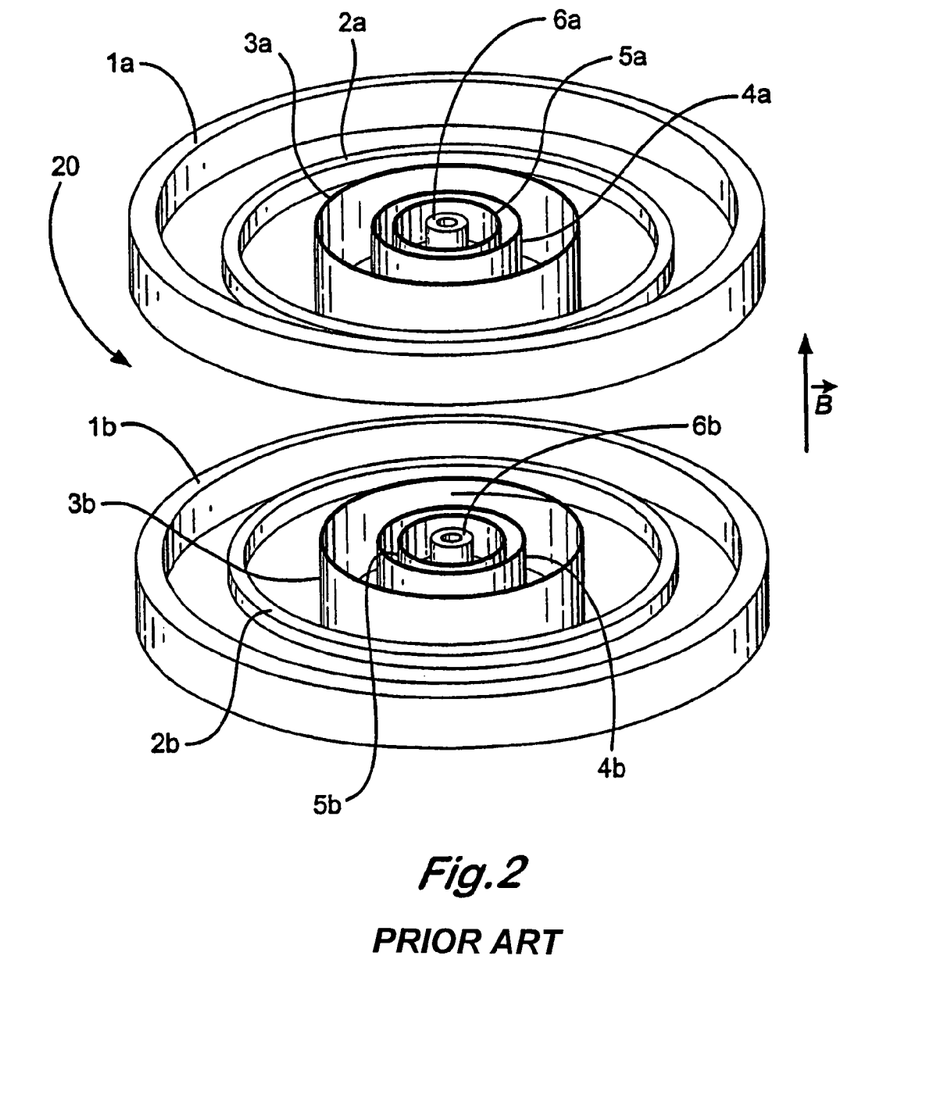

FIG. 2 is a known arrangement of magnetic coils 20, which produce a magnetic field $\vec{B}$, and are comprised of a pair of drive coils 1a, 1b with several pairs of mutually coaxial compensating coils 2a, 2b, 3a, 3b, 4a, 4b, 5a, 5b and 6a, 6b. The pairs of compensating coils are wound superconducting coils.

Theoretically a pair of coaxial coils, each with the same magnitude of current and axial dimensions but with current running in the opposite sense, can be replaced by an annular ring of ferromagnetic material which has been magnetised in the direction of the axis of rotation of the rings. Alternatively, any permanent magnetic material similarly magnetised may be used.

It is an object of the present invention to provide a magnet comprising a series of annular rings of ferromagnetic material which has been magnetised in the direction of the axis of rotation of the rings, thereby improving the magnetic field homogeneity.

It is a further-object of the present invention to provide an improved magnetic field suitable for use in an MRI system using a minimum number of superconducting coils.

Furthermore, it is an object of the present invention to provide a magnet suitable for use in an MRI system which provides a less confined patient space then is currently available with known MRI systems.

According to the present invention there is provided a ferromagnetic structure for use in a magnet assembly, the structure having a central axis and a plurality of coaxial laminations disposed thereon about the central axis such that the structure generates a magnetic field parallel to the central axis.

According to an aspect of the present invention the ferromagnetic structure is magnetically saturated.

According to a further aspect of the present invention the ferromagnetic structure is used in a magnet assembly for use in an MRI system. The assembly may comprise a pair of drive coils arranged such that a primary magnetic field is generated in a direction parallel to a central axis of the pair of drive coils, and a pair of ferromagnetic structures disposed proximate the pair of drive coils, such that a magnetic field generated by the pair of ferromagnetic structures is parallel to the primary magnetic field and functions to improve the homogeneity of the primary magnetic field.

According to a further aspect of the present invention the magnet assembly is used in an MRI system.

According to the present invention there is provided a method of improving the homogeneity of a primary magnetic field, the method comprising the steps of arranging a plurality of coaxial ferromagnetic laminations about a central axis of a structure, disposing a pair of said structures proximate a pair of coaxial drive coils, causing said drive coils to generate a primary magnetic field parallel to the central axis, and causing said pair of structures to generate a magnetic field which is substantially parallel to the primary magnetic field such that the homogeneity of the primary magnetic field is improved.

While the principle advantages and features of the invention have been described above, a greater understanding and appreciation of the invention may be obtained by referring to the drawings and detailed description of the preferred embodiment, presented by way of example only, in which;

Figure 3:
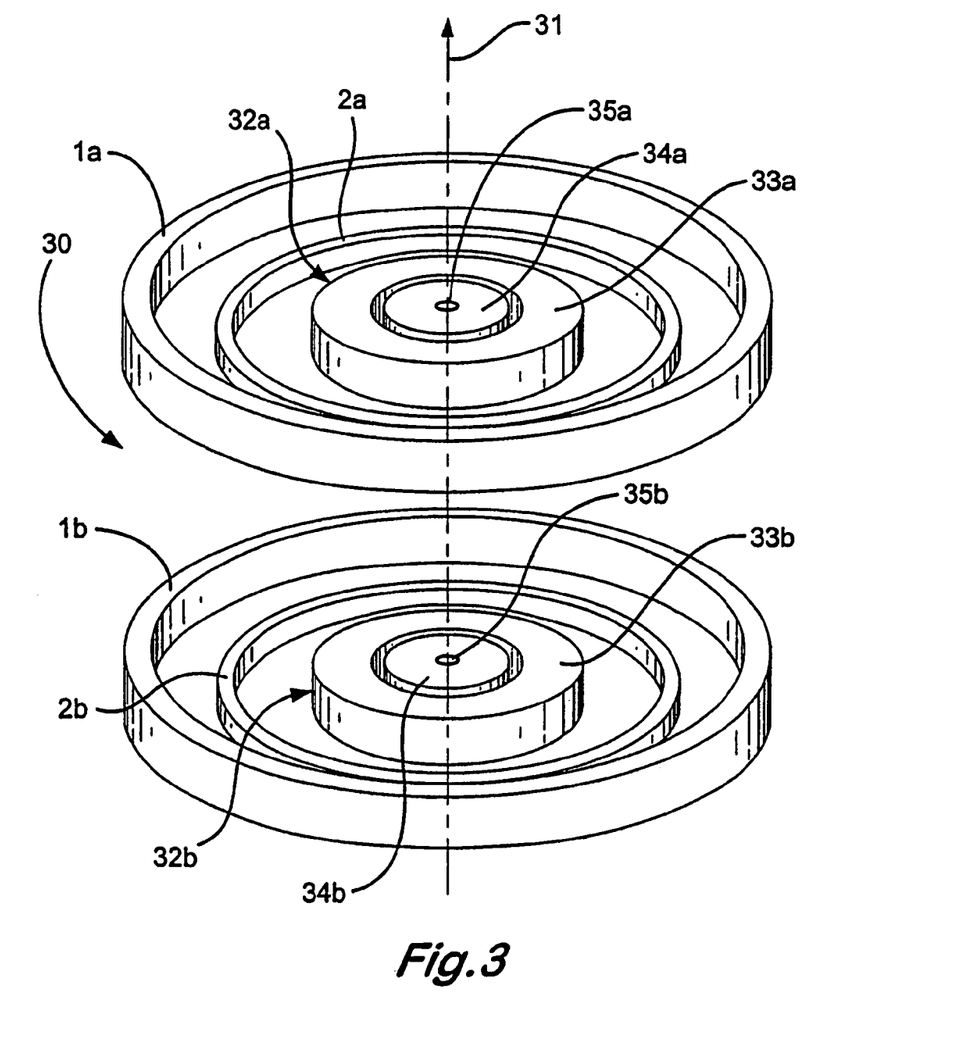
FIG. 3 is a pair of ferromagnetic structures according to a further aspect of the present invention.

In FIG. 3 magnet assembly 30 comprises a pair of drive coils 1a, 1b, a pair of compensating coils 2a, 2b and a pair of ferromagnetic structures 32a, 32b according to an embodiment of the present invention. The currents running through drive coils 1a, 1b are in the opposite sense to the currents running through compensating coils 2a, 2b respectively. In this embodiment the ferromagnetic structures are made of Iron. As will be appreciated by those skilled in the art, other ferromagnetic material such as Cobalt, Nickel or Holmium or alloys thereof may be used, without departing from the scope of the present invention.

The ferromagnetic structures 32a, 32b consist of a series of coaxial rings 33a, 34a, 35a, 33b, 34b, 35b. As is well known in the art, the compensating coils 2a, 2b function to compensate substantially for $2^{nd}$ order non-homogeneity in the primary magnetic field created by drive coils 1a and 1b. The ferromagnetic structures 32a, 32b function to compensate for higher order non-homogeneity in the primary magnetic field. In order for structures 32a, 32b to achieve this compensation they must be magnetically saturated and magnetised in the same direction as the central axis 31 of the structure. To achieve homogeneity in the primary magnetic field to the $12^{th}$ order a ferromagnetic structure consisting of three rings is required.

As will be appreciated by those skilled in the art, the ferromagnetic structures shown in FIG. 3 may take several forms.

Figure 4:
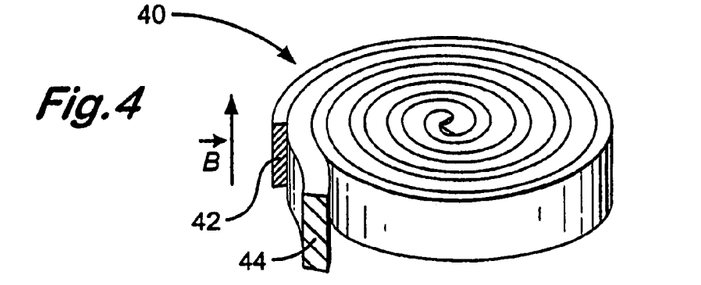
FIG. 4 is a ferromagnetic structure according to yet a further aspect of the present invention.

In FIG. 4 ferromagnetic structure 40 comprises a strip of ferromagnetic material 42, such as steel, and a strip of non-ferromagnetic material 44, such as PTFE. The steel 42 and the PTFE 44 are co-wound together about a central axis parallel to magnetic field $\vec{B}$, to form a double spiral structure. This structure will function similarly to the structure shown in FIG. 3. However, this type of ferromagnetic structure is difficult to manufacture and expensive.

Figure 5:
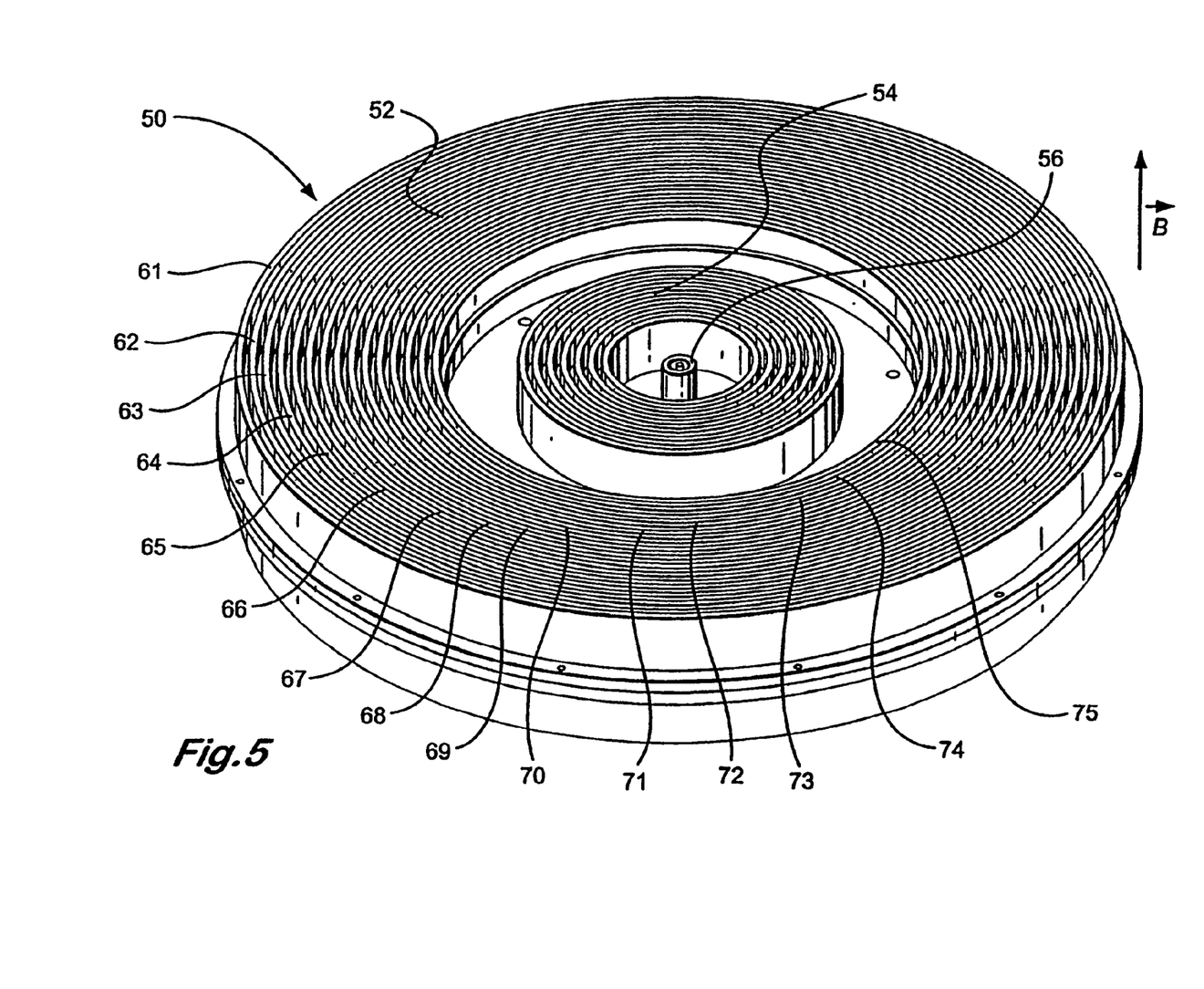
FIG. 5 is a ferromagnetic structure according to yet a further aspect of the present invention.

A preferred embodiment of a ferromagnetic structure according to the present invention is shown in FIG. 5. In FIG. 5 the ferromagnetic structure 50 consists of three coaxial clusters 52, 54, and 56. Each cluster has a series of coaxial laminations. For example, in the outermost cluster 52 there are fifteen laminations 61–75. As will be appreciated the number of laminations may vary depending on the specific design of the structure. The structure is magnetically saturated and the laminations are arranged such that the magnetic field generated by the structure is parallel to the primary magnetic field $\vec{B}$ generated by the drive coils. This is achieved by insuring that the radial thickness of each lamination is less than its axial height. In a preferred embodiment the ratio of the axial height to the radial thickness is greater than three.

Figure 6:
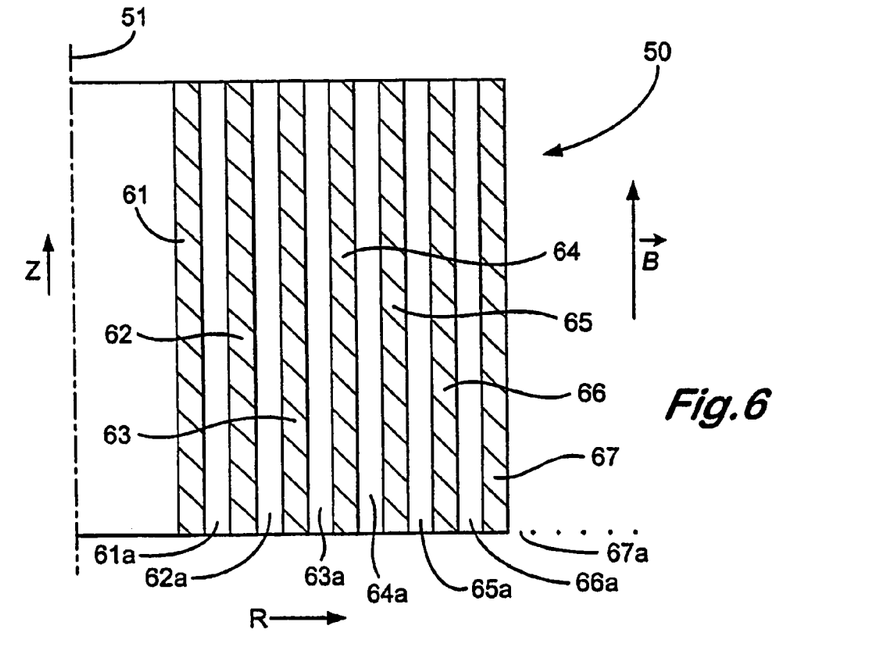
FIG. 6 is a cross section of the ferromagnetic structure shown in FIG. 5.

FIG. 6 shows a cross section of a portion of the structure shown in FIG. 5, where parts also appearing in FIG. 5 bear identical numerical designations. Several of the laminations 61–67 are shown arranged radially around the central axis 51 of the structure 50. The laminations 61–67 are separated by spaces 61a–67a. In a preferred embodiment the radial thickness of a space between two consecutive laminations is less than the radial thickness of each of the two consecutive laminations immediately surrounding the space. For example, the radial thickness of space 61a is less than the radial thickness of laminations 61 and 62. The magnetic field created by the structure 50 is parallel to the direction of the primary magnetic field $\vec{B}$ created by the drive coils.

Figure 7:
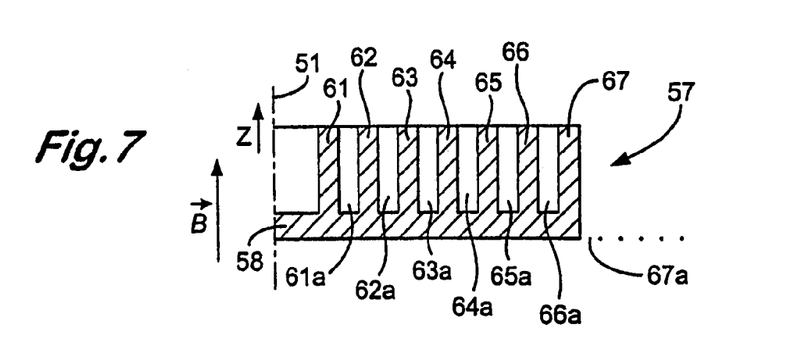
FIG. 7 is an alternative to the ferromagnetic structure shown in FIG. 6.

FIG. 7 shows a ferromagnetic structure 57 similar to the structure 50 shown in FIG. 6. In FIG. 7 the laminations 61–67 have been made by turning deep coaxial rings into a disk 58 of ferromagnetic material. As in FIG. 6, the laminations 61–67 are shown increasing in diameter from the central axis 51 of the structure 57.

In the structures shown in FIGS. 6 and 7 the laminations have at least one axis perpendicular to the direction of the primary magnetic field $\vec{B}$. By insuring that the ratio between the axial height in the Z direction and the radial thickness in the R direction of each lamination is greater than three the direction of magnetisation of the structure will be parallel to the central axis 51 of the structure and thus parallel to the primary magnetic field $\vec{B}$.

As will be appreciated by those skilled in the art the laminations may be made by machining grooves or channels into a solid block of ferromagnetic material. The spaces 61a–67a between the laminations 61–67 may be filled with a non-ferromagnetic material or left empty. As will be appreciated, the amount of material removed from between the laminations will effect the magnetic saturation of the structure.

In yet a further embodiment of the present invention the spaces 61a–67a are filled with shimming material. It is known in the art to use shim plates to further improve the homogeneity of the primary magnetic field. By incorporating the shim plates within the ferromagnetic structure the patient space is advantageously increased.

Figure 8:
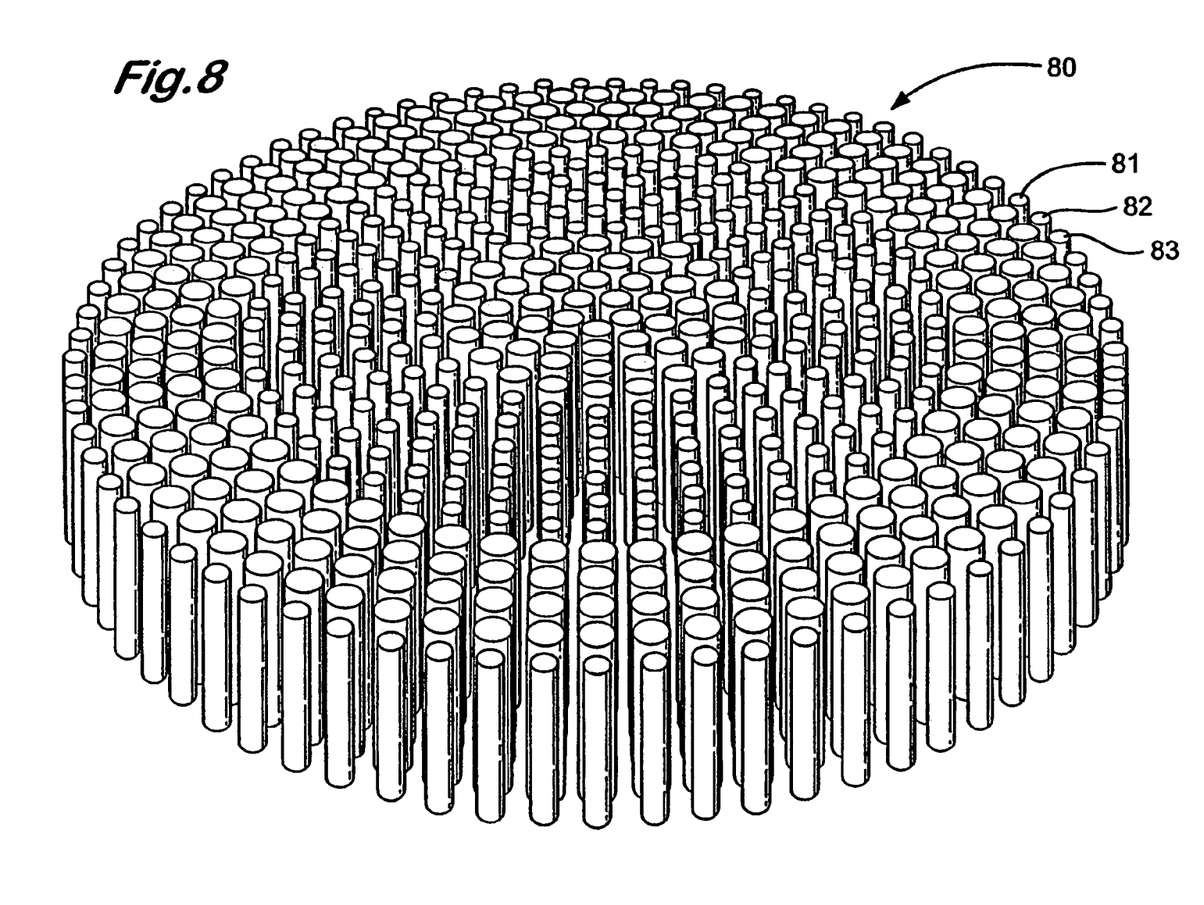
FIG. 8 is a ferromagnetic structure according to yet a further aspect of the present invention.

In FIG. 8 a ferromagnetic structure 80 comprises an arrangement of rods 81, 82, 83 . . . . The rods are attached to a base plate (not shown) and arranged in a pattern to create the desired ring like clusters of laminations similar to those shown in FIG. 5. The base plate may be made of a ferromagnetic material such as Iron. Alternatively, the base plate may be made of a non ferromagnetic material such as stainless steel.

Figure 9:
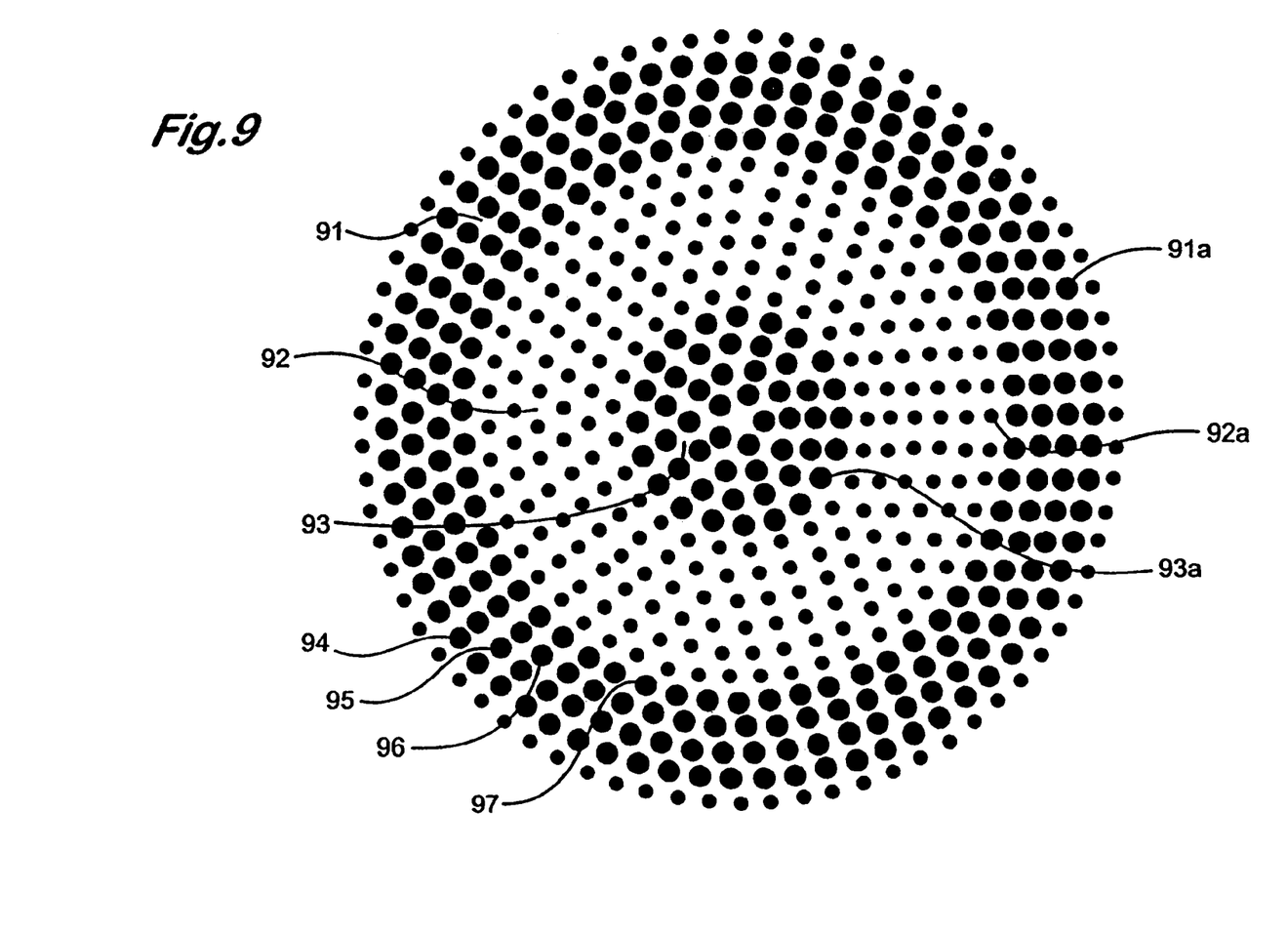
FIG. 9 is a plane view of the ferromagnetic structure shown in FIG. 8.

In FIG. 9 the ferromagnetic structure 90 comprises a plurality of rods arranged in a series of ring like clusters 91, 92, 93. Each cluster has a series of laminations. For example cluster 91 has laminations 94, 95, 96, 97. By varying the diameter of the rods in each cluster higher order improvement in the homogeneity of the primary magnetic field can be achieved. For example, the diameter of rod 91a in cluster 91 differs from that of rod 92a in cluster 92 which in turn differs from that of rod 93a in cluster 93.

Similarly, by varying the spacing and thickness of the laminations shown in FIGS. 3–7, higher order improvement in the homogeneity of the primary magnetic field can be achieved. This has the advantageous effect of enabling the diameter of the drive coils to be reduces, thus reducing the overall size of the MRI system. Furthermore, improved field homogeneity enables the use of faster imaging procedures, thus advantageously reducing the amount of time a patient has to spend in the MRI system.

Figure 10:
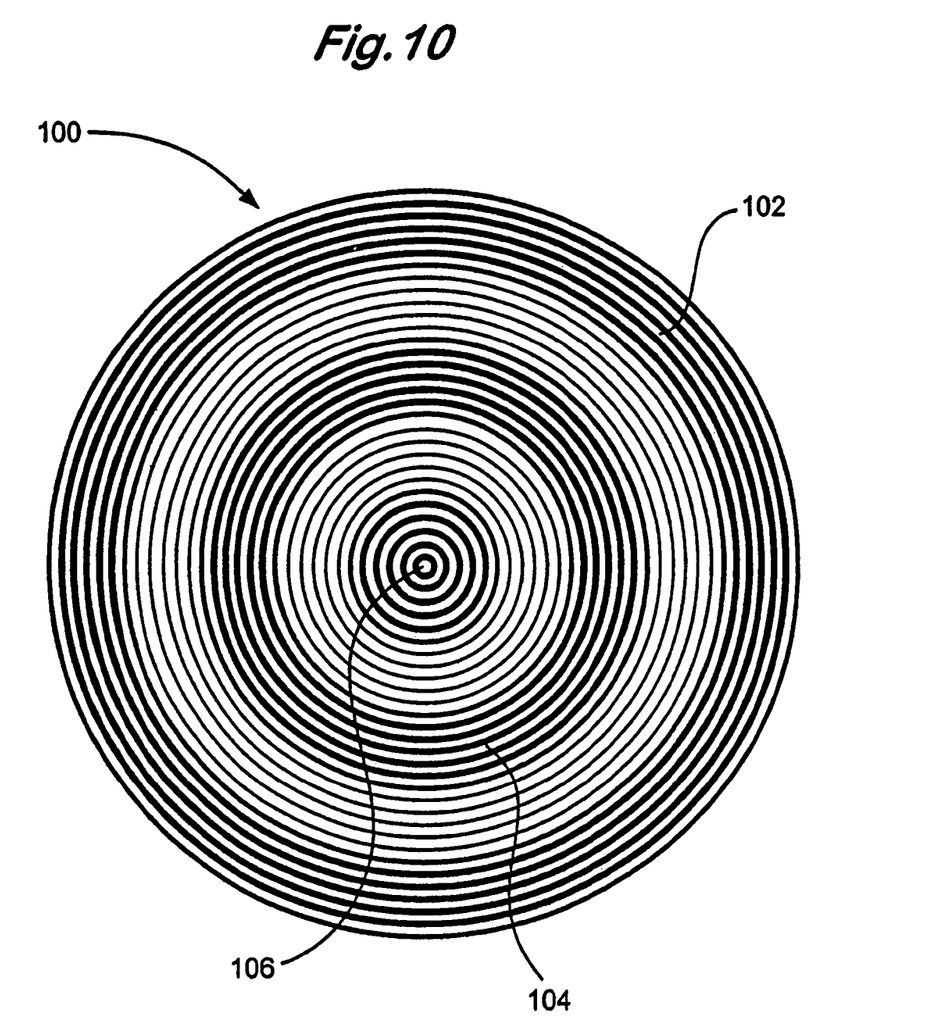
FIG. 10 is a ferromagnetic structure according to yet a further aspect of the present invention.

FIG. 10 shows a ferromagnetic structure 100 according to yet a further embodiment of the present invention. The structure 100 has three series of ring like clusters of lamination 102, 104, 106 with the radial dimensions of some of the laminations and spaces varying. Advantageously, this allows for yet further improvements in the homogeneity of the primary magnetic field. As will be appreciated by those skilled in the art, the radial dimensions of the laminations and spaces and the depth of the spaces will effect the magnetic field created by the structure. Mathematical and numerical models can be used to optimise these parameters to provide the optimum degree of compensation for non-homogeneity in the primary magnetic field.

Figure 11:
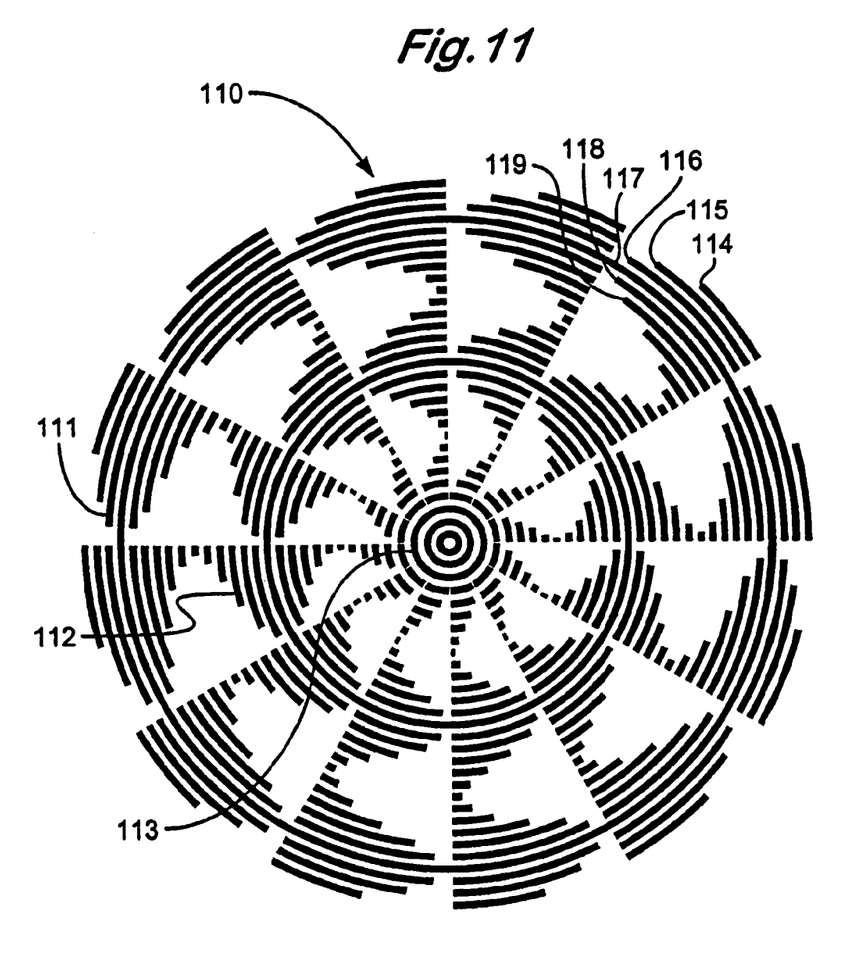
FIG. 11 is a ferromagnetic structure according to yet a further aspect of the present invention.

FIG. 11 shows an alternative to the embodiment shown in FIG. 10. In FIG. 11 the ferromagnetic structure 110 has three ring like cluster 111, 112, 113. Each cluster has a series of laminations with varying azimuthal lengths. For example, cluster 111 has laminations 114–119 each with a different azimuthal length. By varying the azimuthal length of the laminations further improvements may be made to the homogeneity of the primary magnetic field.

As will be appreciated by those skilled in the art, various combination of the previously described embodiments of ferromagnetic structure may be used without departing from the scope of the present invention.

Figure 12:
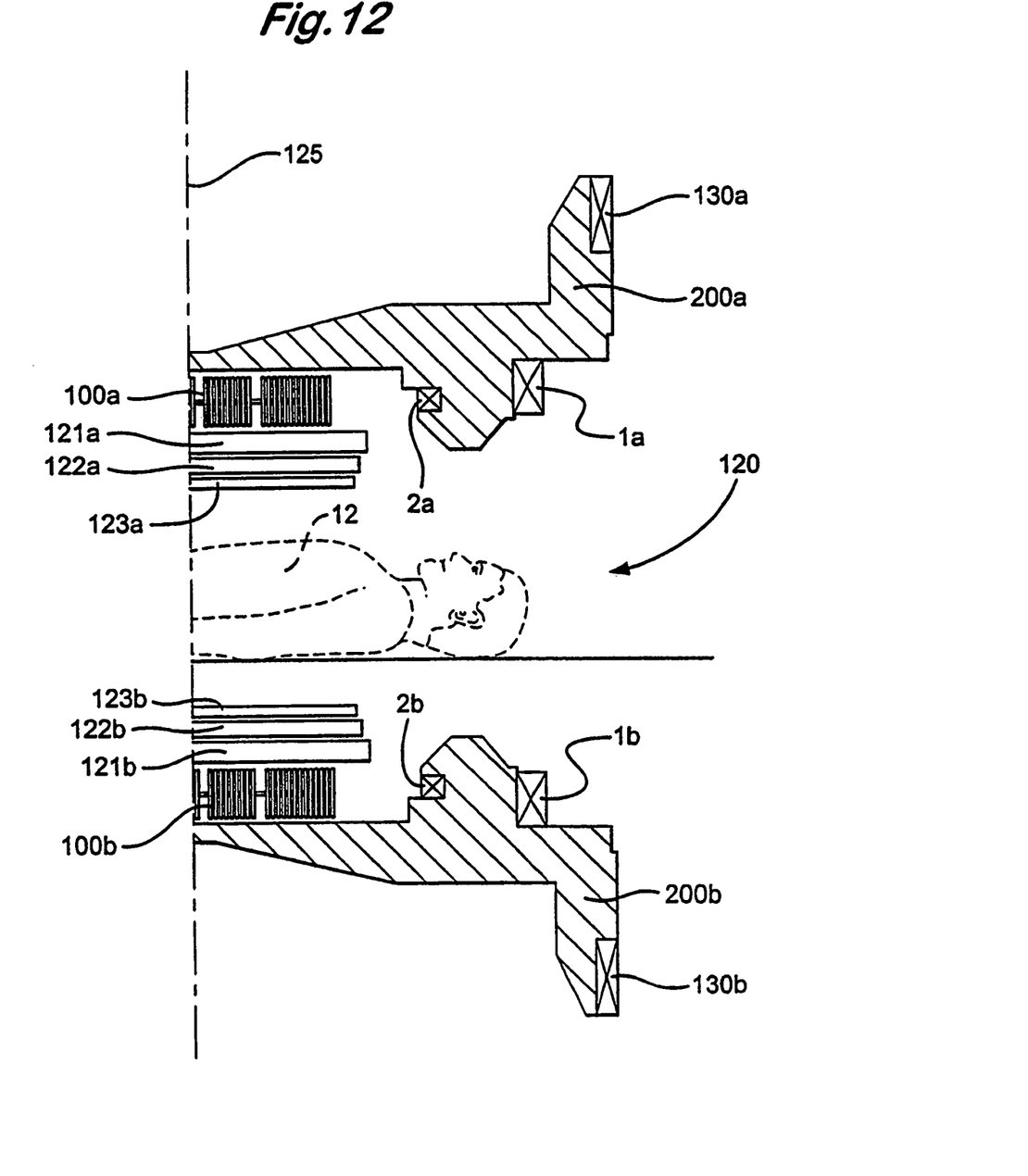
FIG. 12 is an MRI system having an open magnet assembly incorporating the ferromagnetic structure shown in FIG. 10.

FIG. 12 shows a magnet assembly 120 for use in an MRI system which includes a pair of the ferromagnetic structure 100 shown in FIG. 10. The magnet assembly 120 includes a pair of drive coils 1a, 1b which function to provide the primary magnetic field $\vec{B}$ and a pair of compensating coils 2a, 2b which function to compensate substantially for $2^{nd}$ order non homogeneity in the magnetic field $\vec{B}$. The drive coil 1a and the compensating coil 2a are disposed in substantially the same plane as are the drive coil 1b and compensating coil 2b. Coils 1a, 1b, 2a and 2b are coaxial about a central axis 125. The plane of coils 1a and 2a is parallel to the plane of coils 1b and 2b and to the plane of the patient 12. The system further comprises a pair of gradient coils 122a, 122b for superimposing a linearly varying magnetic field over the primary magnetic field and a pair of RF coils 123a, 123b which form part of a transceiver system for signals which are used to construct an image. The system also comprise a pair of shielding coils 130a, 130b. The shielding coils function to reduce the leakage of magnetic fields in to the surround area. The coils 1a, 2a, 130a and 1b, 2b, 130b are arranged on formers 200a and 200b respectively.

The system also includes a pair of ferromagnetic structures 100a, 100b disposed coaxial about the central axis 125. The structures function to provide compensation for higher order non-homogeneity in the magnetic field $\vec{B}$. The ferromagnetic structures are preferably disposed in the same plane as the drive coils, thereby reducing the overall space required for each magnet assembly. This arrangement also facilitates the manufacture of a temperature controlling unit for the system.

As was previously stated, the ferromagnetic structures are preferably magnetically saturated and are arranged such that the magnetic field generated by the structures is parallel to the direction of the primary magnetic field $\vec{B}$.

As will be appreciated by those skilled in the art, the ferromagnetic structures 100a, 100b shown in FIG. 12, may be replaced with any of the embodiments of ferromagnetic structures previously described and shown in FIGS. 2–11.

It is well known that a change in temperature within a magnet assembly will adversely effect the operation of an MRI system. In an alternative embodiment of the present invention the ferromagnetic structures are temperature controlled. This may be achieved with a Peltier device or other temperature controlling means. The ferromagnetic structures may be temperature controlled separately. Alternatively, the ferromagnetic structures may be incorporated within the temperature cooled device used on the drive coils. This may be a cryostat structure. By incorporating the ferromagnetic structures within the cryostat temperature stability is further improved.

In yet another embodiment, a further pair of ferromagnetic structures are included in the magnet assembly. This will further improve the homogeneity of the primary magnetic field.

As is well known in the art, the building in which an MRI system is housed can adversely effect the homogeneity of the primary magnetic field. In yet a further embodiment, the ferromagnetic structures 100a, 100b are adjustable in both the axial and radial planes. By adjusting the position of the ferromagnetic structures an optimum position can be found which reduces these effects. As will be appreciated other degrees freedom, such as tip and tilt, may be incorporated into the adjustment means.

The open magnet assembly shown in FIG. 12 may further include a pair of shim plates 121a, 121b which function to further improve the homogeneity of the primary magnetic field. Alternatively, the shim plates may be incorporated into the ferromagnetic structures 100a, 100b. This will advantageously increase the space surrounding the patient 12.

As will be appreciated by those skilled in the art, the ferromagnetic structures previously described and according to the present invention, may be incorporated into an open MRI system as shown in FIG. 12. Alternatively, the ferromagnetic structures may be incorporated into a C type MRI system.

As will be appreciated by those skilled in the art, various modifications may be made to the embodiment hereinbefore described without departing from the scope of the present invention.

The invention claimed is:

1. A ferromagnetic laminated structure configured for use in a magnet assembly which is operable in an MRI system, the structure being radially laminated, and having a central axis and a plurality of radially stacked concentric annular laminae which collectively form the radially laminated structure, said concentric annular laminae being disposed about the central axis such that, during operation of the magnet assembly, the structure is magnetically saturated in a direction parallel to the central axis, and generates a magnetic field parallel to the central axis, wherein at least one of radial thickness, depth, and an azimuthal length, of at least one of the plurality of concentric annular laminae is different from the corresponding feature of at least one other of the plurality of concentric annular laminae.

2. A method of improving the homogeneity of a primary magnetic field generated by a magnet assembly, the method comprising the steps of:
disposing a pair of ferromagnetic laminated structures according to claim 1 proximate a pair of coaxial drive coils of said-magnet assembly;
causing said drive coils to generate a primary magnetic field parallel to the central axis; and
causing said pair of ferromagnetic laminated structures to generate a magnetic field, which is substantially parallel to the primary magnetic field, such that the homogeneity of the primary magnetic field of the magnet assembly is improved.

3. A ferromagnetic laminated structure as claimed in claim 1, wherein the ferromagnetic structure comprises iron.

4. A ferromagnetic laminated structure as claimed in claim 1, wherein each of the plurality of concentric annular laminae has a radial thickness, which is less than its axial height.

5. A ferromagnetic laminated structure as claimed in claim 4, wherein the ratio of the axial height to the radial thickness of each lamina is greater than three.

6. A ferromagnetic laminated structure as claimed in claim 1, wherein:
adjacent laminae of the plurality of concentric annular laminae have a space therebetween; and
the radial thickness of the space is less than the radial thickness of each of the adjacent laminae.

7. A ferromagnetic laminated structure as claimed in claim 6, wherein the space between said adjacent laminae is substantially filled with a non-ferromagnetic material.

8. A ferromagnetic laminated structure as claimed in claim 1, wherein the structure comprises of a plurality of ferromagnetic rods that are disposed parallel to the central axis of the annular structure.

9. A ferromagnetic laminated structure as claimed in claim 8, wherein the plurality of ferromagnetic rods are disposed on a plate.

10. A ferromagnetic laminated structure as claimed in claim 8, wherein the ferromagnetic rods are arranged in a series of coaxial ring-like clusters.

11. A ferromagnetic laminated structure as claimed in claim 9, wherein the plate is non-ferromagnetic material.

12. A magnet assembly configured for use in an MRI system, the assembly comprising:
a pair of drive coils arranged such that a primary magnetic field is generated in a direction parallel to a central axis of the pair of drive coils; and
a pair of annular ferromagnetic laminated structures disposed proximate the pair of drive coils, such that a magnetic field generated by the pair of ferromagnetic laminated structures is parallel to the primary magnetic field generated by the drive coils and functions to improve homogeneity of said primary magnetic field;
wherein said annular ferromagnetic laminated structures are radially laminated, and have a central axis and a plurality of radially stacked concentric annular laminae which collectively form the radially laminated structure, said concentric annular laminae being disposed about the central axis such that, during operation of the magnet assembly, the structure is magnetically saturated in a direction parallel to the central axis, and generates a magnetic field parallel to the central axis, wherein at least one of radial thickness, depth, and an azimuthal length, of at least one of the plurality of concentric annular laminae is different from the corresponding feature of at least one other of the plurality of concentric annular laminae.

13. A magnet assembly as claimed in claim 12, wherein said assembly further comprises at least one additional pair of said annular ferromagnetic laminated structures disposed proximate the pair of drive coils.

14. A magnet assembly as claimed in claim 12, wherein a position of at least one of the annular ferromagnetic laminated structures is adjustable in both axial and radial directions.

15. A magnet assembly as claimed in claim 12, further comprising means for controlling a temperature of at least one of the annular ferromagnetic laminated structures.

16. An MRI system comprising a magnet assembly as claimed in claim 12.

17. A magnet assembly as claimed in claim 16, wherein the system includes a pair of shielding coils in order to prevent leakage of magnetic fields.

18. A ferromagnetic laminated structure configured for use in a magnet assembly which is operable in an MRI system, the structure being radially laminated, and having a central axis and a plurality of radially stacked concentric annular laminae which collectively form the radially laminated structure, said concentric annular laminae being disposed about the central axis such that, during operation of the magnet assembly, the structure is magnetically saturated in a direction parallel to the central axis, and generates a magnetic field parallel to the central axis, wherein a spacing between one pair of adjacent annular laminae is different from the spacing between another pair of adjacent annular laminae.

* * * * *